(12) United States Patent
Kerber et al.

(10) Patent No.: US 8,410,575 B2
(45) Date of Patent: Apr. 2, 2013

(54) HIGH VOLTAGE SEMICONDUCTOR DEVICES AND METHODS OF FORMING THE SAME

(75) Inventors: Martin Kerber, Munich (DE); Uwe Wahl, Munich (DE)

(73) Assignee: Infineon Technologies Austria AG, Villach (AT)

( * ) Notice: Subject to any disclaimer, the term of this patent is extended or adjusted under 35 U.S.C. 154(b) by 269 days.

(21) Appl. No.: 12/750,187

(22) Filed: Mar. 30, 2010

(65) Prior Publication Data

US 2011/0241160 A1 Oct. 6, 2011

(51) Int. Cl.
*H01L 27/08* (2006.01)
*H01L 21/38* (2006.01)

(52) U.S. Cl. .................................. 257/531; 438/238

(58) Field of Classification Search .................... 257/531
See application file for complete search history.

(56) References Cited

U.S. PATENT DOCUMENTS

| | | | |
|---|---|---|---|
| 5,589,708 A | | 12/1996 | Kalnitsky |
| 5,936,298 A | * | 8/1999 | Capocelli et al. ............. 257/531 |
| 6,031,445 A | * | 2/2000 | Marty et al. .................. 336/200 |
| 6,083,802 A | * | 7/2000 | Wen et al. ..................... 438/381 |
| 6,291,872 B1 | * | 9/2001 | Wang et al. .................... 257/531 |
| 6,486,017 B1 | * | 11/2002 | Verma et al. .................. 438/238 |
| 6,524,926 B1 | * | 2/2003 | Allman et al. ................ 438/387 |
| 6,545,314 B2 | | 4/2003 | Forbes et al. |
| 6,856,226 B2 | * | 2/2005 | Gardner ........................ 336/192 |
| 2001/0013755 A1 | * | 8/2001 | Ogawa et al. .................. 313/496 |
| 2003/0003603 A1 | * | 1/2003 | Chaudhry et al. ................ 438/3 |
| 2005/0230837 A1 | | 10/2005 | Taghizadeh-Kaschani |
| 2007/0120639 A1 | | 5/2007 | Strzalkowski et al. |
| 2010/0019391 A1 | | 1/2010 | Strzalkowski |

OTHER PUBLICATIONS

Hori, T., et al., "A MOSFET with Si-implanted Gate-SiO$_2$ Insulator for Nonvolatile Memory Applications," IEEE, 1992, pp. 469-472.
Wendler, E., et al., "Structural changes and Si redistribution in Si$^+$ implanted silica glass," Nuclear Instruments and Methods in Physics Research B 116, 1996, pp. 332-337, Elsevier.

* cited by examiner

*Primary Examiner* — Fernando L Toledo
*Assistant Examiner* — Karen Kusumakar
(74) *Attorney, Agent, or Firm* — Slater & Matsil, L.L.P.

(57) ABSTRACT

High voltage semiconductor devices and methods of fabrication thereof are described. In one embodiment, a method of forming a semiconductor device includes forming first trenches in an insulating material. A trap region is formed in the insulating material by introducing an impurity into the first trenches. The first trenches are filled with a conductive material.

34 Claims, 8 Drawing Sheets

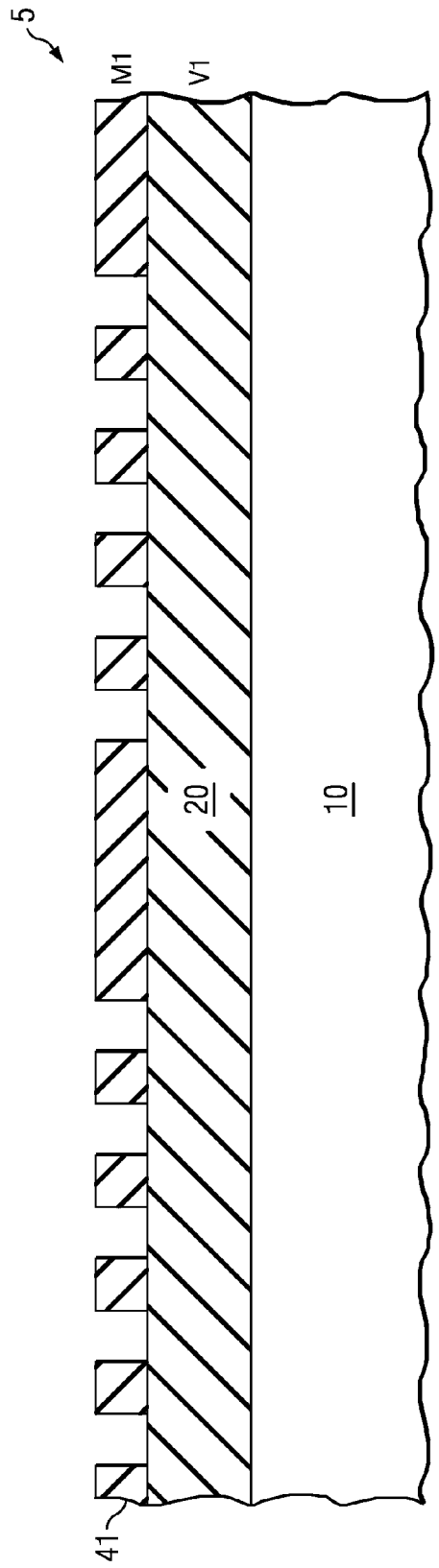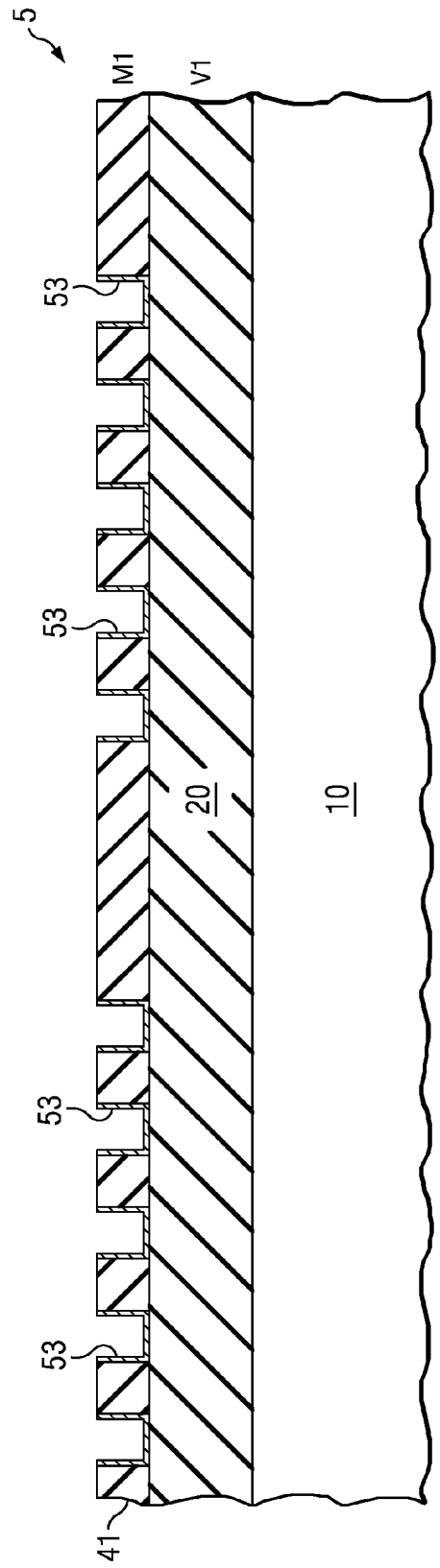

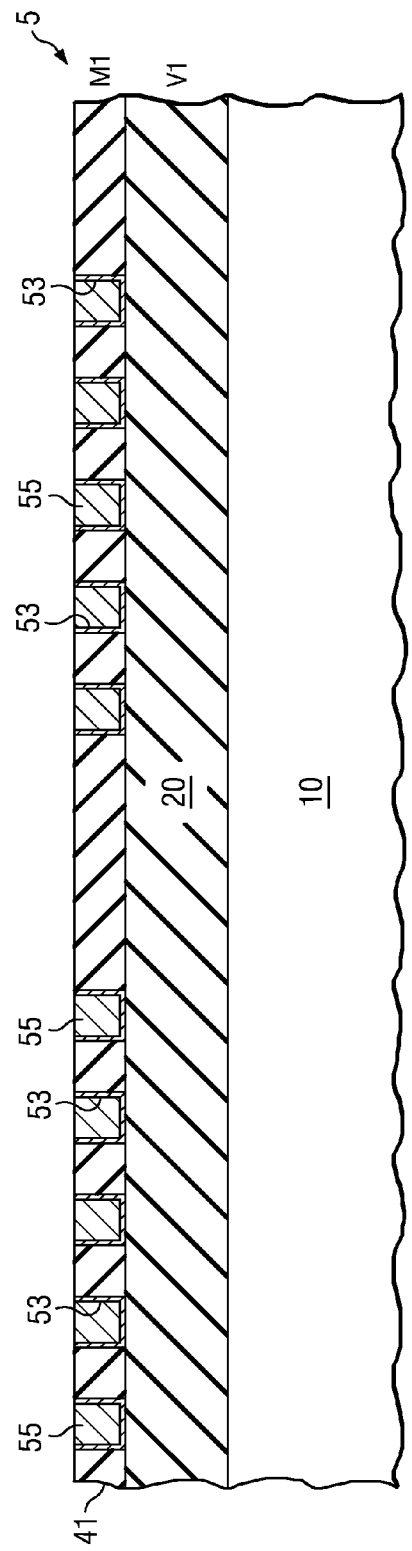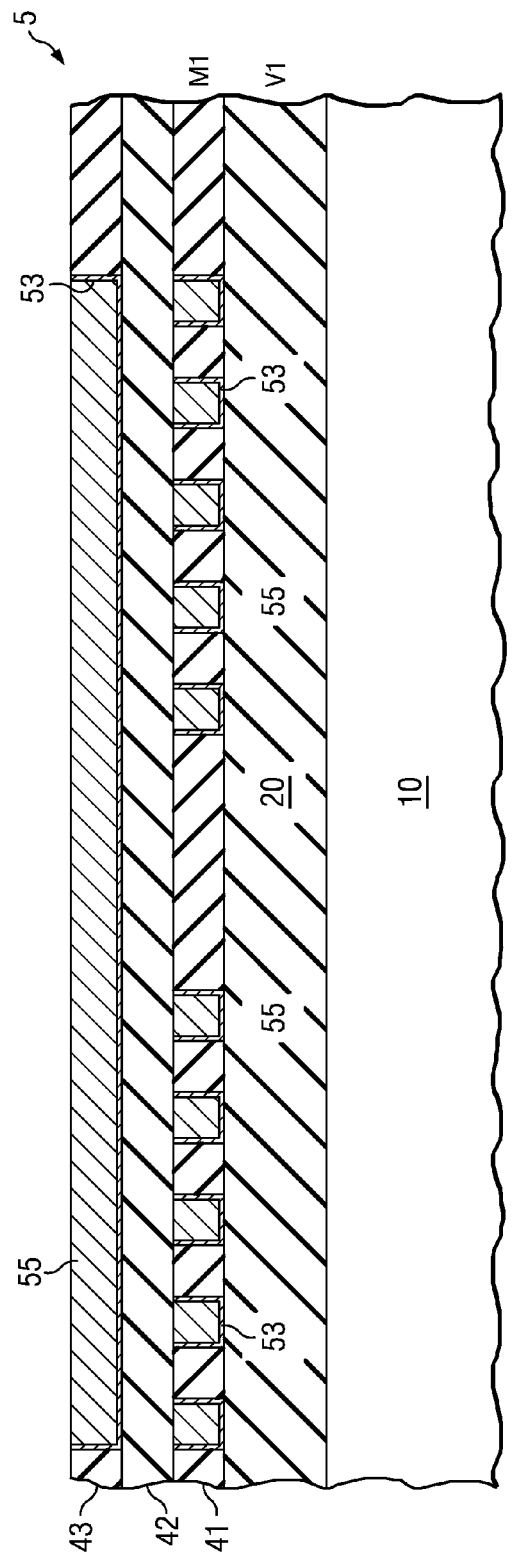

HIGH VOLTAGE SEMICONDUCTOR DEVICES AND METHODS OF FORMING THE SAME

TECHNICAL FIELD

The present invention relates generally to semiconductor devices, and more particularly to high voltage semiconductor devices and methods of forming the same.

BACKGROUND

Generally, semiconductor devices are used in a variety of electronic applications, such as computers, cellular phones, personal computing devices, and many other applications. Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (ICs). There may be a plurality of transistors, memory devices, switches, conductive lines, diodes, capacitors, logic circuits, and other electronic components formed on a single die or chip, for example.

Typically semiconductor devices operate at different operating conditions than conventional devices that store or transfer energy. For example, many semiconductor devices operate at much lower voltages than the conventional battery voltage or power transmission voltage. In many applications, transformers help to make the transition between different operating voltages by converting electricity at one voltage to electricity at another voltage, either of higher or lower value. A transformer achieves this voltage conversion using a primary coil and a secondary coil, each of which comprise a number of turns of an electrical conductor. The primary coil is connected to a source of voltage and the secondary coil is connected to a load. The ratio of turns in the primary coil to the turns in the secondary coil (turns ratio) is about the same as the ratio of the voltage of the source to the voltage of the load.

In many applications, transformers are integrated with the semiconductor device having the primary circuits. In such technologies, transformers are fabricated in metallization layers of a single chip and function to transfer signal and power. However, integration of a transformer on a single chip is challenging. For example, high electric fields exist between the primary and secondary coil which can result in reliability problems. Successful integration of transformers requires overcoming these and other problems.

SUMMARY OF THE INVENTION

These and other problems are generally solved or circumvented, and technical advantages are generally achieved, by illustrative embodiments of the present invention.

Embodiments of the invention include high voltage semiconductor devices. In accordance with one embodiment, a method of fabricating a semiconductor device includes forming first trenches in an insulating material. A trap region is formed in the insulating material by introducing an impurity into the first trenches. The first trenches are filled with a conductive material.

In another embodiment, a semiconductor device includes a first coil overlying a semiconductor substrate. An insulation material is disposed over the first coil. A second coil is disposed in the insulation material. A trap region is disposed under the second coil in the insulation material.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes

FIG. 2, which includes FIGS. 2a-2g, shows cross-sectional views of a transformer during various stages of fabrication, in accordance with an embodiment;

FIG. 4, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1A:
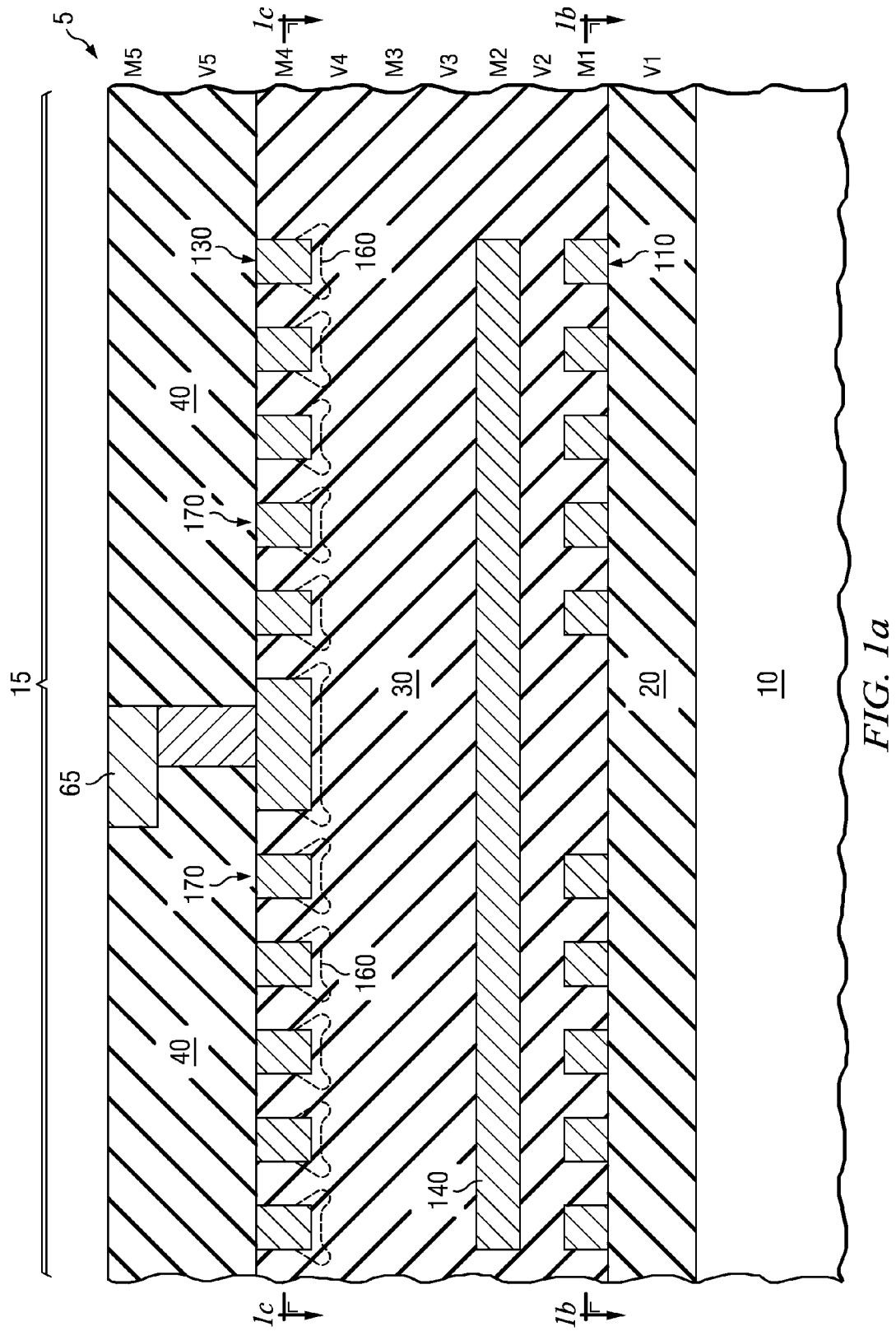
FIGS. 1a-1c, illustrates a transformer in accordance with an embodiment of the invention.

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A transformer includes a high side coil coupled to a power source and a low side coil coupled to internal circuitry. The high and low side coils are separated by a thick insulating layer. Integration of such transformers on a single chip suffers from many integration complexities arising from the drastic operating conditions required. Such components must ensure stable operation despite heavy changes in operating conditions. The power side may be susceptible to large voltage surges over very short times. For example, spikes of the order 10,000V may be produced over a time period of 2 µs. Rapid surges in the high side power source may produce a large voltage difference between the low side and high side coil.

This large voltage difference creates a large electric field through the insulating layer between the high side and low side coils. If this insulating layer breaks down, large currents may be transferred from the high side coil to the low side coil. As a result, the product may fail to operate and/or damage can occur to other components in the chip and any adjoining chips that are electrically coupled with this component. Therefore, the insulating layer should not breakdown even under such voltage surges.

Sharp curvatures are inherently produced in the fabrication processes that define the metal lines of the high side coil. Such sharp curvatures of the metal lines cause severe field crowding producing high local electric fields. High electric fields produce two competing phenomenon.

First, electronic trap sites in the vicinity of high electric fields capture charge and are filled up thereby forming charged trap sites. The presence of these charged trap sites forms a Coulomb shield effectively reducing the local electric field. This charging mechanism is dominated by the trapping dynamics, which depends on the density of traps and the distance of the traps to the adjacent metallic interface (e.g., distance to high side coil). High quality dielectrics conventionally used in back end of the line dielectric layers typically have less number of trap sites and therefore do not rapidly build-up trap charges.

Second, at high electric fields, bonds within the dielectric break resulting in dielectric breakdown. If the applied voltage is increased gently, trapping dynamics and therefore the local high field spots are shielded by Coulomb clouds and the intrinsic dielectric strength is reached. However, if the voltage is increased faster than the charge trapping rate, the dielectric material breaks down locally in the high field hot spots (such as around corners of metal lines). Thereby the dielectric fails even though the intrinsic dielectric strength is much higher.

In various embodiments, the invention avoids the dielectric breakdown during voltage surges by improving the trapping dynamics. In various embodiments, impurity atoms are introduced around trench corners thereby accelerating the formation of the Coulomb shield that minimizes field crowding around sharp corners. The presence of impurities effectively rounds the corners of the trenches in terms of its electrostatic action without the use of expensive process changes that would be necessary to physically round the trench corners.

Figure 1B:
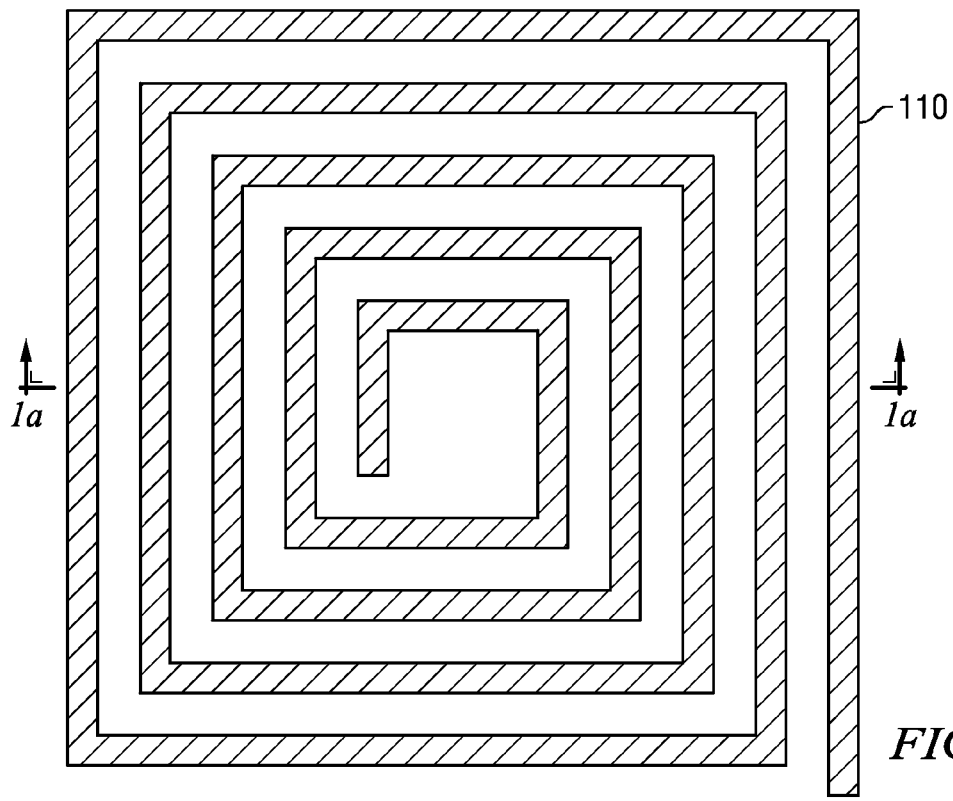
Figure 1C:
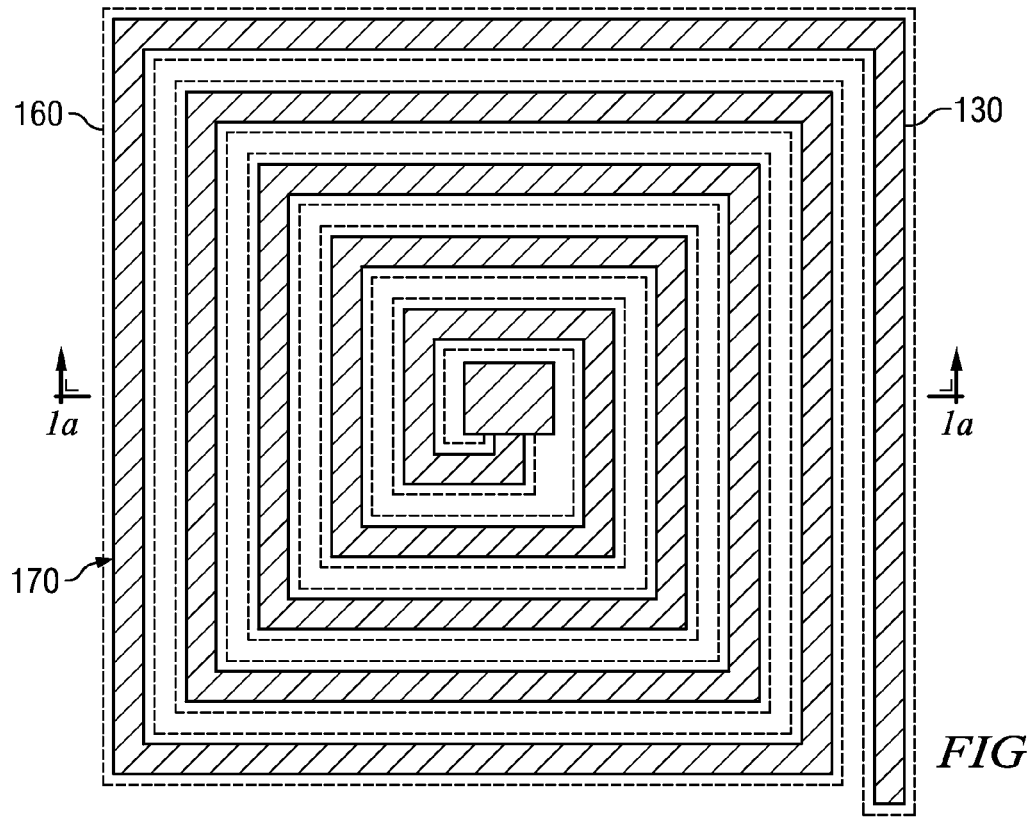

FIG. 1, which includes FIGS. 1a-1c, illustrates a structural embodiment of the invention. FIG. 1a illustrates a cross section of a portion of the chip, FIG. 1b illustrates a sectional view of a portion of the chip illustrated in FIG. 1a by line 1b, and FIG. 1c illustrates a sectional view of a portion of the chip illustrated in FIG. 1a by line 1c.

FIG. 1a illustrates a cross sectional view of the chip 5, the chip 5 (not shown to scale) contains active circuitry (not shown) disposed inside it. The active circuitry contains active device regions and includes necessary transistors, resistors, capacitors, inductors or other components used to form integrated circuits. For example, active areas that include transistors can be separated from one another by isolation regions.

Next, metallization is formed over the active device regions to electrically contact and interconnect the active devices. The metallization and active device regions together form a completed functional integrated circuit. In other words, the electrical functions of the chip 5 can be performed by the interconnected active circuitry. In logic devices, the metallization may include many layers, e.g., nine or more, of copper or alternatively of other metals. In memory devices, such as DRAMs, the number of metal levels may be less and may be aluminum.

The chip cross-section (FIG. 1a) illustrates various levels of metallization. The five metal levels comprising $M_1$, $M_2$, $M_3$, $M_4$, and $M_5$ are stacked vertically and connected by contact and via levels $V_1, V_2, V_3, V_4,$ and $V_5$. In other embodiments, more or fewer metal and via levels may be used. However, in FIG. 1a, as only the transformer 15 portion of the chip 5 is illustrated, not all features of the metal levels and via levels are shown.

A plurality of vias (not shown) of different designs are disposed above the substrate 10 coupling a plurality of metal lines in different metal levels. The substrate 10 is a wafer or an oxide layer over the wafer.

A first dielectric 20 is disposed over the substrate 10 forming the first via level. Vias or contact plugs (not shown) are embedded into the first dielectric 20 coupling active devices (not shown) in a portion of the chip 5 having transistors etc. The first dielectric 20 typically comprises silicon oxide such as tetra ethyl oxysilane (TEOS) or fluorinated TEOS (FTEOS), but in various embodiments may comprise insulating materials typically used in semiconductor manufacturing for inter-level dielectric (ILD) layers.

Referring again to FIG. 1, a portion of the chip 5 shows a transformer 15. As illustrated in FIG. 1a, the transformer 15 comprises a first coil 110 and a second coil 130. FIGS. 1b and 1c illustrate the top view of the first coil 110 and second coil 130 respectively.

A second dielectric 30 is disposed over the first dielectric 20. An optional etch stop liner is present between the first and second dielectrics 20 and 30 (not shown). The second dielectric 30 can comprise silicon oxide such as tetra ethyl oxysilane (TEOS), or fluorinated TEOS (FTEOS), but in various embodiments may comprise insulating materials typically used in semiconductor manufacturing for inter-level dielectric (ILD) layers. The second dielectric 30 may include etch stop layers in various embodiments. In some embodiments, the second dielectric 30 comprises a low-k dielectric for minimizing delay arising from parasitic capacitances between vias or metal lines. Alternately, in some embodiments, the second dielectric 30 may be different from the dielectric in the metallization or metal levels. For example, the second dielectric 30 may be formed after masking the remaining chip 5 (such as active device regions) and opening only the transformer 15 so that the second dielectric 30 is different than the dielectric layers over the remaining chip 5.

In various embodiments, the second dielectric 30 comprises a plurality of insulating layers such that each insulating layer comprises a via or a metal level. In some embodiments, each metal level or a via level may be disposed within a plurality of insulating layers.

The first and the second coils 110 and 130 are separated by the second dielectric 30 or any other suitable dielectric layer. In the illustrated embodiment, the first coil 110 is disposed in the first metal level $M_1$, above a first dielectric 20. In other embodiments, the first coil 110 may be disposed in other metal levels. In various embodiments, the first coil 110 is coupled to a driver logic circuit (not shown), for example, through the first via level or the second via level.

An optional metal plate 140 is disposed between the first coil 110 and the second coil 130. The metal plate 140 avoids any capacitive coupling with other circuitry such as logic circuitry disposed adjacent the transformer 15. In various embodiments, the metal plate 140 is coupled to a fixed potential.

In various embodiments, the first coil 110, the second coil 130, and the metal plate 140 comprise an inner core and an outer liner. The inner core comprises a first conductive material, whereas the outer liner comprises a second conductive material, which minimizes out-diffusion of the first conductive material during subsequent thermal processing. The first conductive material typically comprises copper although some embodiments may comprise aluminum, tungsten, silver, gold, or other conductive materials. The second conductive material comprises a diffusion barrier metal such as titanium nitride, titanium, tantalum, tantalum nitride, tungsten nitride, tungsten carbo nitride (WCN), ruthenium or other suitable conductive nitrides or oxides.

In one or more embodiments, the first and the second coils 110 and 130 are designed as uninterrupted lines or trenches forming a spiral in the minimum dimensions of the respective metal level. However, other design variants, such as arrays of rectangular, square or circular or elongated structures, may also be used.

The illustrated transformer 15 is a coreless transformer. In various embodiments however, the transformer 15 may include a magnetic core to concentrate the magnetic field lines and improve inductance. In one or more embodiments, the magnetic core may comprise a ferromagnetic or ferrimagnetic material including MnZn ferrite, NiZn ferrite, NiFe ferrite, NiCuZn alloy, mu-metals, iron, nickel, and combinations thereof.

In various embodiments, the second dielectric 30 comprises trap regions 160 disposed under the second coil 130. In particular, the trap regions 160 are disposed around the corners of the trenches 170 in which the second coil 130 is formed. As illustrated in FIG. 1c, the trap regions 160 are formed under the trenches 170.

In various embodiments, the trap regions 160 trap electrons and/or holes when a potential is applied on the second coil 130. The charge storing or trapping capability of the trap regions 160 of the second dielectric 30 accelerates the formation of Coulomb shield in the vicinity of edges of the trenches 170 of the second coil 130 when a potential is applied to the second coil 130. The Coulomb shields reduce the local electric fields and thus improve the surge test immunity of the transformer to rapid voltage surges.

In various embodiments, the presence of charge traps in the trap regions 160 increases the charge trapping rate. The charge trapping rate is proportional to the number of charge traps, the capture cross-section of the charge trap, the electric field driving the reaction, and the distance from the conductive material of the second coil 130. Therefore, an increase in the total number of charge traps increases the charge trapping rate thereby accelerating the formation of a Column shield. The formation of the Column shield reduces the effective local electric field. This reduction in electric field avoids hard dielectric breakdown which can damage the dielectric material.

In various embodiments, the trap region 160 comprises group IV elements such as carbon, silicon, germanium, tin, lead; group III elements such as B, Ga, In; and group V elements such as phosphorus, arsenic, antimony. In one or more embodiments, the trap region 160 may include metal atoms such as Ti, V, Cr, Mn, Fe, Co, Ni, Cu, Au, and Zn. In another embodiment, the trap region 160 may include inert atom implants such as He, Ne, Ar.

In various embodiments, the trap region 160 extends to about 20 nm to about 50 nm from a top surface of the second dielectric 30 (from bottom surface of trenches 170). In various embodiments, the trap regions 160 are formed primarily around the corners of the trenches 170, for example, in a shape of a partial dumbbell or tear drops separated by a thin channel as illustrated in FIG. 1a.

In the illustrated embodiment, a passivation layer 40 is disposed over the second dielectric 30. In some embodiments, further dielectric layer comprising more metal levels may be disposed over the second dielectric 30. The passivation layer 40 includes bond pads 65 for coupling the transformer to external devices including a circuit board. In one or more embodiments, the passivation layer 40 comprises silicon dioxide layer because it is impervious to diffusion or transport of moisture through it. In other embodiments, the passivation layer 40 comprises other suitable materials.

Figure 2E:
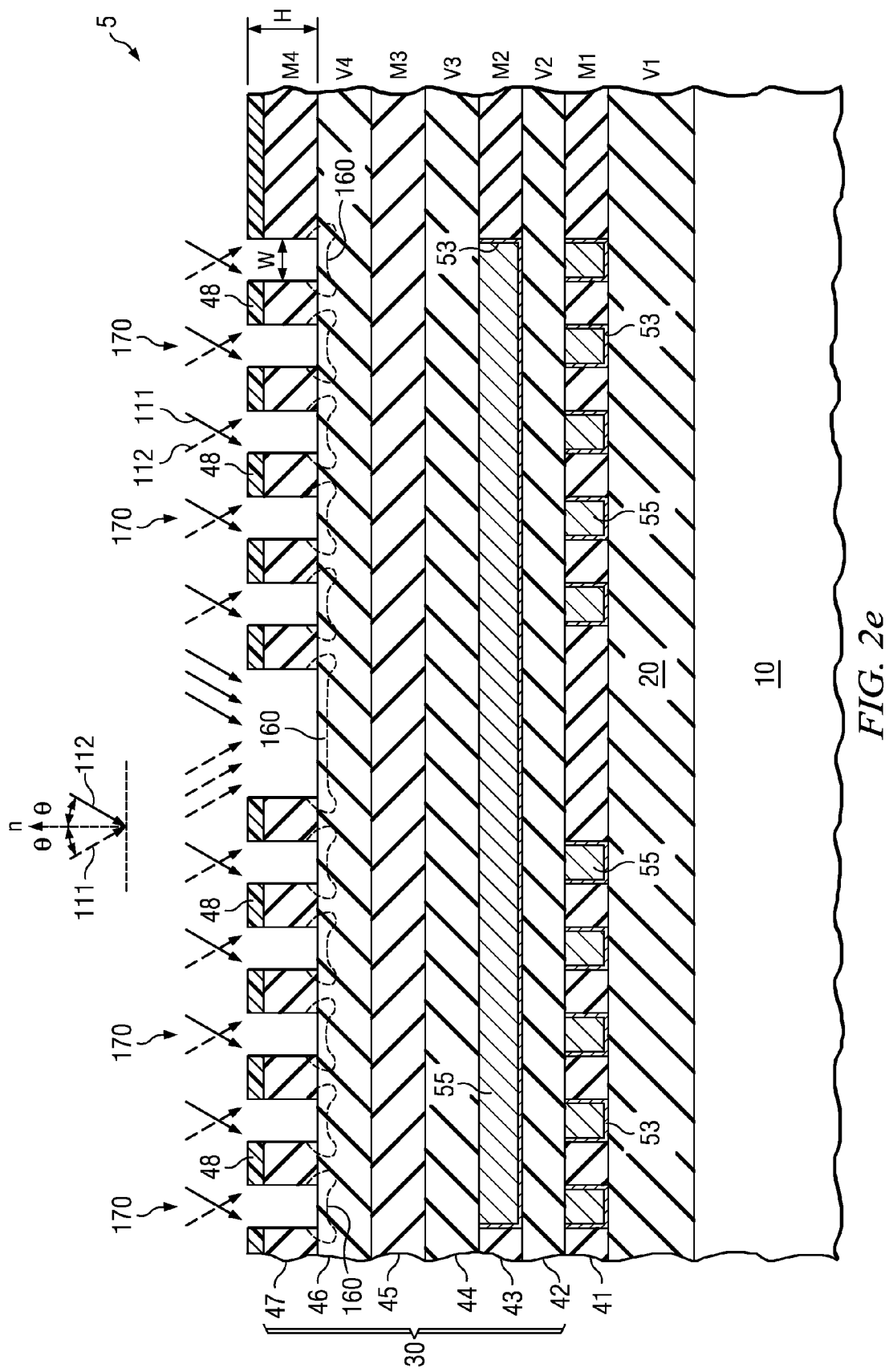
Figure 2F:
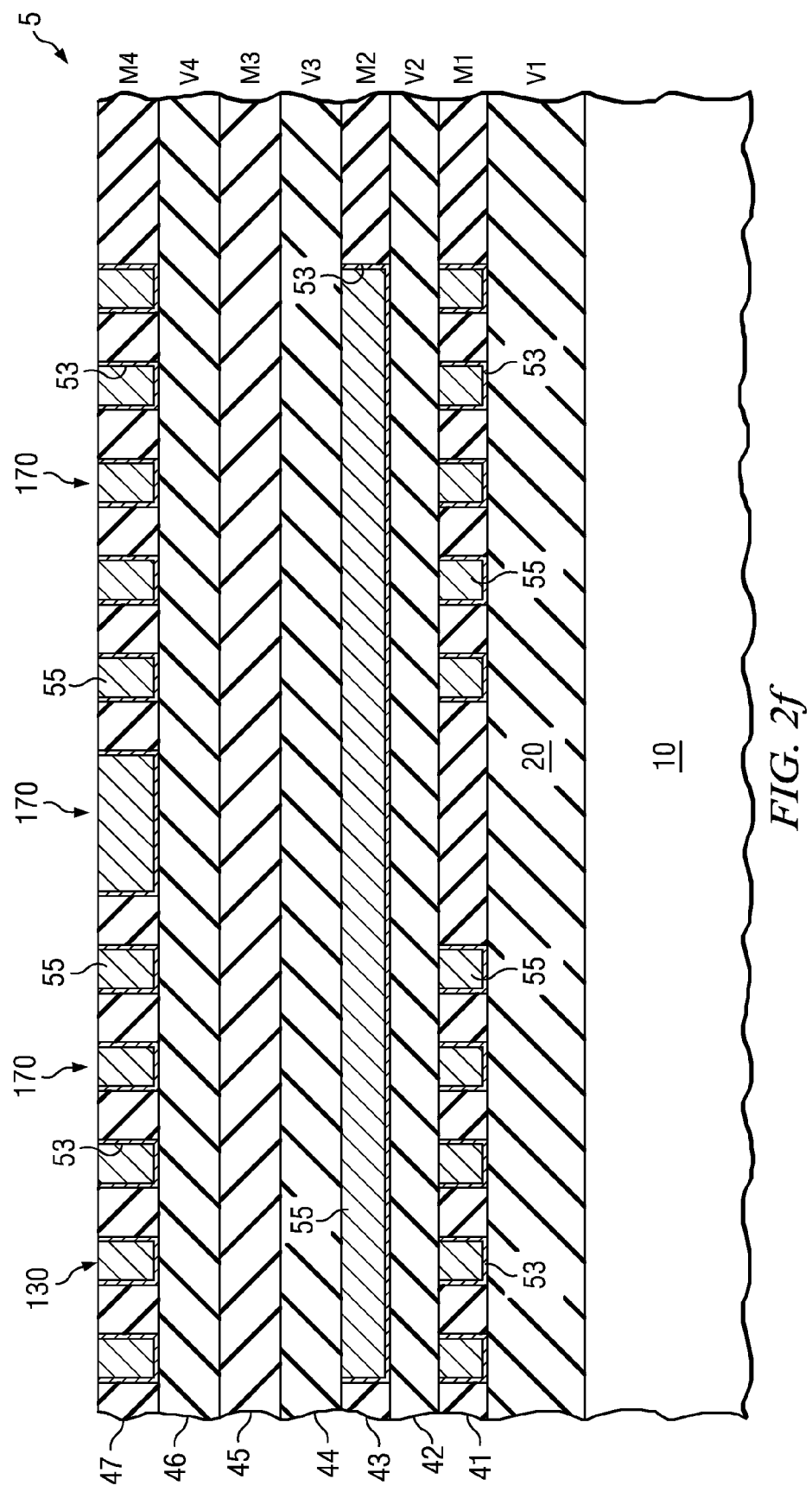
Figure 2G:
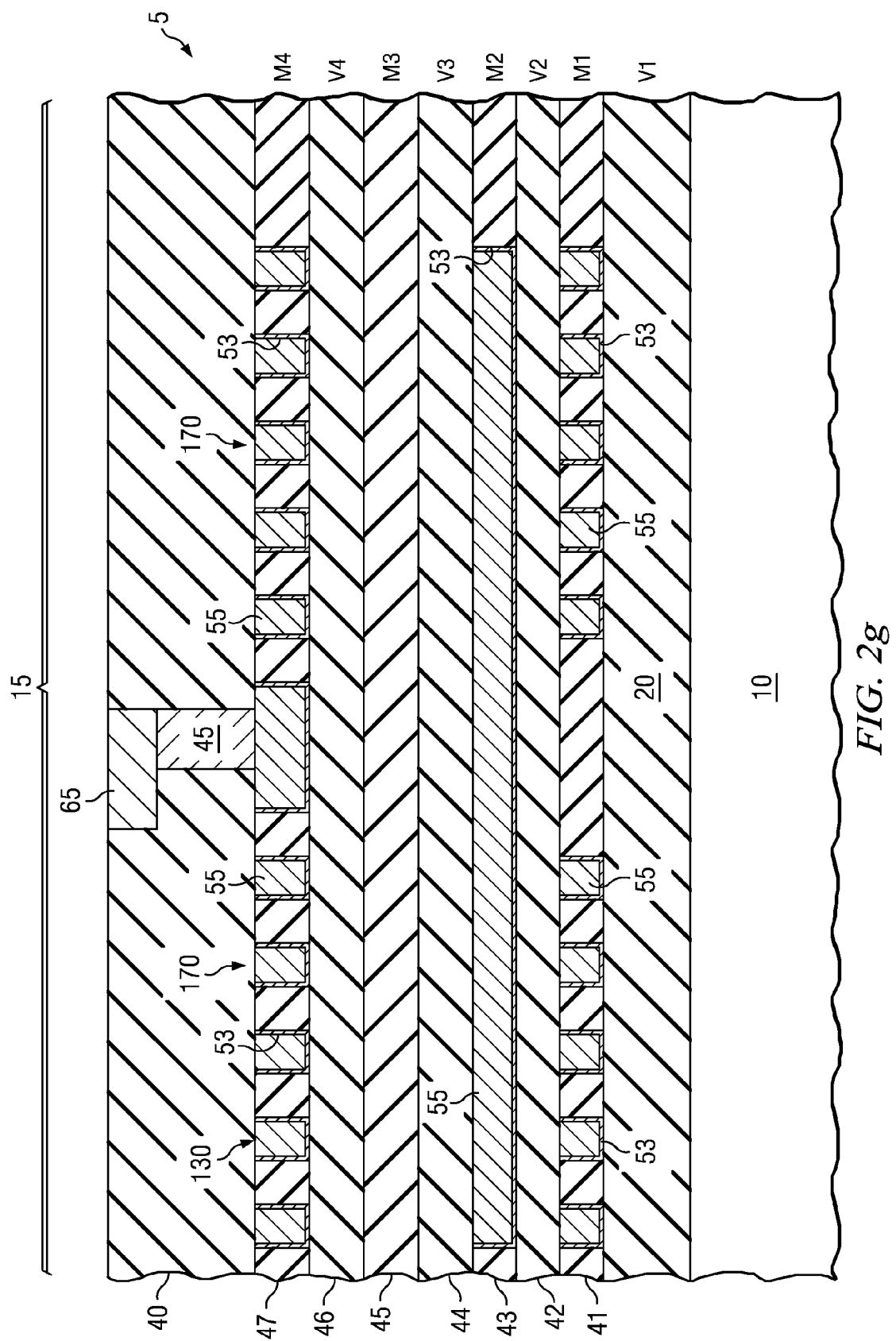

FIG. 2, which includes FIGS. 2a-2g, shows cross-sectional views of a transformer during various stages of fabrication, in accordance with an embodiment.

With reference now to FIG. 2a, the transformer portion of the chip 5 is illustrated after front-end processing. In various embodiments, at this stage in the process, the front end processes are completed and active devices fabricated in the active regions (not shown) of the substrate 10. The active regions are formed near a top surface of a substrate 10.

The active regions can include transistors, resistors, capacitors, inductors or other components used to form integrated circuits. For example, active areas that include transistors (e.g., CMOS transistors) are separated from one another by isolation regions, e.g., shallow trench isolation.

The components formed during the front-end processing are interconnected by back end of line (BEOL) processing. Referring to FIG. 2a, a first dielectric 20 is deposited over the substrate 10. Contacts plugs (not shown) are formed within the first dielectric 20 to contact device regions of the substrate 10. In one embodiment, the first coil 110 (to be formed as shown in FIG. 1a) is coupled to other logic circuits through contact plugs made within the first via level $V_1$.

In one embodiment, the first dielectric 20 comprises silicon oxide such as tetra ethyl oxysilane (TEOS) or fluorinated TEOS (FTEOS). In one or more embodiments, the first dielectric 20 may comprise a low-k insulating material or an ultra-low-k (ULK) material. In various embodiments, the first dielectric 20 may comprise insulating materials typically used in semiconductor manufacturing for inter-level dielectric (ILD) layers, such as doped glass (BPSG, PSG, BSG), organo silicate glass (OSG), carbon doped oxides (CDO), fluorinated silicate glass (FSG), spin-on glass (SOG), or dense SiCOH.

The first dielectric 20 may also include etchstop layers such as silicon nitride (SiN), silicon oxynitride (SiON), silicon carbide (SiC) or silicon carbo nitride (SiCN). A low-k dielectric material may be sandwiched between etchstop layers thereby forming the first dielectric 20 in one embodiment. The first dielectric 20 may comprise a thickness of about 500 nm or less in one or more embodiments.

The first coil 110 and second coil 130 (as shown in FIG. 1) are formed in the various metallization levels in the transformer region of the chip 5. The first and the second coils 110 and 130 may be fabricated using either single damascene or a dual damascene process in various embodiments. In a single damascene process, a single layer of insulating material is patterned with a pattern for conductive features, such as conductive lines, conductive vias. In contrast, in a dual damascene process, the vias and metals lines are patterned for conductive features and filled in a single fill step with a conductive material. A single damascene process will be described using FIGS. 2b-2h.

A first insulating layer 41 is deposited over the first dielectric 20. As described above, the first insulating layer 41 comprises silicon dioxide or other suitable low-k dielectric materials. The first insulating layer 41 is patterned using lithography. The mask used during this lithography step is not an additional, but is common to the metallization level for the active circuitry. FIG. 2a illustrates a patterned first insulating layer 41.

FIG. 2b illustrates the first insulating layer 41 after the deposition of a liner 53. The liner 53 may include a barrier layer (to prevent metal diffusion) and seed layer for electroplating. In various embodiments, the liner 53 comprises titanium nitride, titanium, tantalum, tantalum nitride, tungsten nitride, tungsten carbo nitride (WCN), ruthenium or other suitable conductive nitrides or oxides. In one or more embodiments, the liner 53 is deposited using a vapor deposition process such as chemical vapor deposition or physical vapor deposition process.

FIG. 2c illustrates the structure after filling of conductive metal 55 and subsequent planarization using, for example, chemical mechanical planarization, forming first coil 110. A conductive metal 55 is electroplated with a metal, such as copper, to overfill the openings of the patterned first insulating layer 41. The overfilled conductive metal 55 is polished using chemical mechanical polishing. A liner 53 may be optionally deposited over the conductive metal 55 thereby capping it to protect the conductive metal 55 from diffusing into the surrounding insulating material.

A second insulating layer 42 and a third insulating layer 43 are deposited as illustrated in FIG. 2d. The second insulating layer 42 and the third insulating layer 43 may be deposited as a single layer in some embodiments (if using dual damascene process). The third insulating layer 43 is patterned and filled with the conductive metal 55 after forming a liner 53.

Referring to FIG. 2e, fourth, fifth, sixth, and seventh insulating layers 44, 45, 46, and 47 are formed over the third insulating layer 43, each of the fourth, fifth, sixth, and seventh insulating layers 44, 45, 46, and 47 have metal levels ($M_3$, $M_4$) and via levels ($V_3$, $V_4$) formed within. Collectively, these layers are referred to as dielectric layer 30.

In an alternative embodiment, after forming the fourth, fifth, sixth, and seventh insulating layers 44, 45, 46, and 47 for the metal levels ($M_3$, $M_4$) and via levels ($V_3$, $V_4$), the transformer 15 region of the chip 5 is exposed while blocking the remaining area of the chip 5, e.g., with a resist such as a hard mask. Accordingly, the fourth, fifth, sixth, and seventh insulating layers 44, 45, 46, and 47 may be etched and removed from the transfer 15 region of the chip 5. A new dielectric layer may be deposited over the first coil 110 in the transformer 15 region. Further, in some embodiments, some or all layers of the fourth, fifth, sixth, and seventh insulating layers 44, 45, 46, and 47 may be replaced with the new dielectric.

The use of a different dielectric in the transformer 15 allows the use of low-k dielectrics for other parts of the chip 5 while using dielectrics more suitable for transformers. For example, because of the large voltages applied across transformer coils, dielectrics with inherently high dielectric breakdown may be more suitable as the insulating material for the transformer 15. As a consequence, the required dielectric breakdown for the transformer 15 may be much higher than that of back end of the line layers for other regions of the chip 5.

The seventh insulating layer 47 (or newly deposited dielectric) is patterned using lithography for forming the second coil 130 in the fourth metal level $M_4$. The patterned seventh insulating layer 47 comprises open trenches as illustrated in FIG. 2e. In alternate embodiments, the pattern for the second coil 130 may be included in other metal levels including metal levels lower than or higher than the fourth metal level.

For ease of explaining subsequent steps, a second dielectric 30 is defined to comprise the second, the third, the fourth, the fifth, the sixth, and the seventh insulating layers 42-47.

In various embodiments, an impurity atom is implanted into the open trenches of the second dielectric 30. The implant damages the second dielectric 30 introducing trap states within the insulator. In particular, the implant damages a region adjacent the top surface of the second dielectric 30, e.g., the seventh insulating layer 47. Thereby, trap regions 160 are formed in the implanted region of the second dielectric 30.

In various embodiments, the trap regions 160 are formed primarily around the corners of the trenches 170, for example, in a partial dumbbell shape as illustrated in FIG. 2e. Alternatively, the trap regions 160 have a tear drop shape at each trench corner.

In one or more embodiments, the impurity atoms are implanted before a mask layer 48 used to etch the seventh insulating layer 47 is removed. Thus the mask layer 48 protects the surface of the seventh insulating layer 47 from being implanted with the impurity atom.

In various embodiments, the implanted species, including implant conditions such as energy and dose are selected such that the implanting breaks some of the atomic bonds within the second dielectric 30. In various embodiments, point defects may be formed within a region of the second dielectric 30. For example, the implanted atom may displace a silicon or oxygen atom in the second dielectric 30 creating an oxygen or silicon interstitial and leaving an empty silicon or oxygen site in the structure (silicon or oxygen vacancy) of the second dielectric 30. The interstitials and vacancies thus generated may have various charge states, and may act to trap charge of opposite polarity. For example, positively charged silicon interstitials or vacancies may trap electrons.

Further, the implanted impurity may form trap states which are neutral but can trap electrons or release electrons leaving a positive space charge. For example, an oxygen vacancy in the oxide may be filled with hydrogen forming a neutral trap with the silicon atoms. However, under an excess hole population, a neutral hydrogen atom may be separated from the silicon atom trapping the holes at the oxygen vacancy. A generic representation of the reaction may involve a trapping of electron of a hole ($h^+$) or electron ($e^-$) by a neutral trap ($T^0$) and represented as follows.

The charge storing capability of implanted region of the second dielectric 30 accelerates the formation of Coulomb shield in the vicinity of edges of the second coil 130 when a potential is applied to the second coil 130. The Coulomb shields reduce the local electric fields improving the immunity of the transformer to voltage surges.

In various embodiments, the implant species may comprise group IV elements such as carbon, silicon, germanium, tin, lead; group III elements such as B, Ga, In; and group V elements such as phosphorus, arsenic, antimony. In one or more embodiments, the implant species may include metal atoms such as Ti, V, Cr, Mn, Fe, Co, Ni, Cu, Au, and Zn. Alternatively, atoms that are rejected or are unstable in the second dielectric 30 may be used in some embodiments. Such atoms may be preferred to avoid introducing any new impurity into the second dielectric 30. Examples of such implants may include inert atom implants such as He, Ne, and Ar, as well as hydrogen or dueterium.

The implant energy is chosen to damage only about the top 20 nm to about 50 nm of the second dielectric 30 (seventh insulating layer 47 or underlying insulating layers). In one embodiment, silicon implants of about 10 keV to about 50 keV are used. The implant dose may be chosen to be about $10^{14}$ cm$^{-2}$ to about $10^{16}$ cm$^{-2}$. Alternatively, in another embodiment, the implant dose may be chosen to be about $10^{13}$ cm$^{-2}$ to about $10^{15}$ cm$^{-2}$.

In another embodiment, arsenic implants of about 10 keV to about 50 keV are used. The implant dose may be chosen to be about $10^{14}$ cm$^{-2}$ to about $10^{16}$ cm$^{-2}$. In yet another embodiment, boron implants of about 1 keV to about 20 keV are used.

In various embodiments, the energy of the implant is chosen such that the peak concentration is about 20 to about 40 nm under the bottom surface of the second coil 130.

In alternative embodiments, the impurity atoms may be introduced using other doping techniques including plasma doping, and drive-in diffusion after depositing a doped layer over the trenches 170.

In various embodiments, the impurity is implanted at a tilt into the second dielectric 30. In one or more embodiments, a sequence of tilted implants is used to introduce the impurity atom into the second dielectric 30. Consequently, the trap regions 160 are formed primarily around the corner regions, which will have increased field crowding when an electric field is applied.

In one embodiment, a 4-rotation implant is performed such that each implant is rotated by 90 degrees. For example, a first implant 111 is performed from the left side of the page at a first angle θ to the surface normal n to the seventh insulating layer 47 (vertical direction on paper). This is illustrated in FIG. 2e by arrows inclined from the left side. A second implant 112 is performed from the right side of the page. The second implant 112 is therefore also tilted similar to the first angle θ but has a 90° rotation relative to the first implant. This is illustrated in FIG. 2e by arrows inclined from the right side. Thus the first and the second implants 111 and 112 are implanted from opposite directions.

Similarly, in some embodiments, an implant aligned into the plane of the paper may be paired with another implant aligned out of the plane of the paper. Thus a four rotation implant may be used in some embodiments. Alternatively, in some embodiments, only two implants may be used.

In various embodiments, the first angle θ is about 10° to about 50°. In one embodiment, the first angle θ is about 25°. In one embodiment, the first angle θ is selected such that the tangent of the first angle θ is about the width (W) of the trench 170 divided by a height (H) of the trench 170 and represented as $\tan(\theta)=W/H$.

Referring to FIG. 2f, the second coil 130 is formed by filling the open trenches in the seventh insulating layer 47 with a conductive material 55. The mask layer 48, if any, is removed before filling the conductive material 55 in some embodiments. As previously described, a liner 53, which may include both a barrier and seed layer, is deposited following the filling of the trenches 170 with a conductive metal 55.

In various embodiments, the liner 53 comprises titanium nitride, titanium, tantalum, tantalum nitride, tungsten nitride, tungsten carbo nitride (WCN), ruthenium or other suitable conductive nitrides or oxides. In one or more embodiments, the liner 53 is deposited using a suitable deposition process such as chemical vapor deposition or physical vapor deposition process. After filling with the conductive metal 55 using an electroplating process, excess conductive metal 55 is removed using a planarization process. The planarization may be performed using a chemical mechanical polishing in one or more embodiments. A further liner 53 may be optionally deposited over the conductive metal 55 thereby capping it.

As next illustrated in FIG. 2g, a passivation layer 40 is formed over the seventh insulating layer 47. The passivation layer 40 comprises silicon dioxide layer and may be deposited using a chemical vapor deposition process in one embodiment.

The passivation layer 40 is next patterned for bond pads. The patterned passivation layer 40 is filled with a conductive metal 45 forming bond pads 65. The bond pads 65 couple the second coil 130 of the transformer 15 to external devices including a circuit board.

Figure 3:
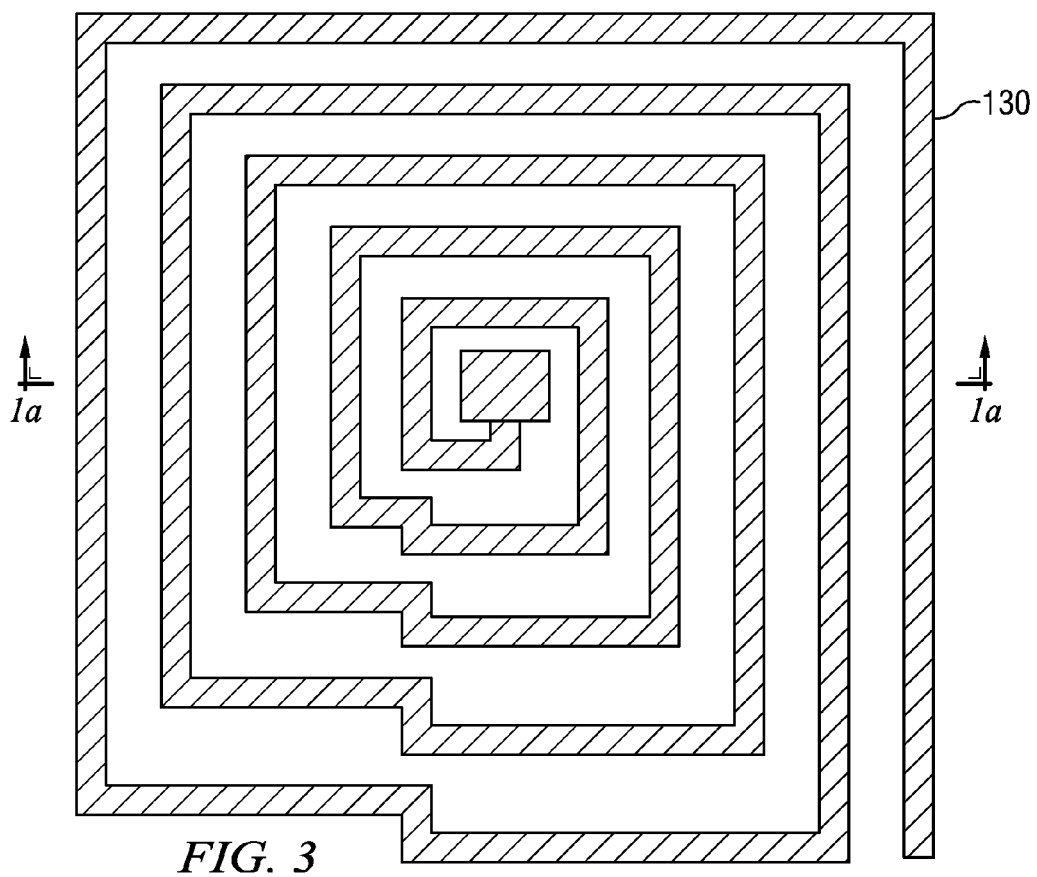
FIG. 3, illustrates an embodiment of the transformer having a rectangular coil.

FIG. 3 illustrates an alternate structural embodiment of the transformer coil. In FIG. 1c, a spiral coil was shown. However in various embodiments, other types of coils may be used. FIG. 3 shows a rectangular coil wherein all metal lines of the coil are laid out either in horizontal or vertical directions. FIG. 3 illustrates a second coil 130 having such a rectangular layout. In various embodiments, both the first coil 110 and the second coil 130 may include such an rectangular layout.

Figure 4A:
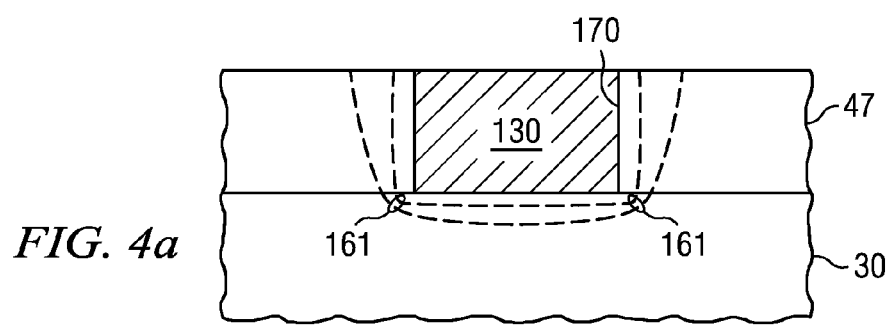
FIGS. 4a and 4b, illustrates a magnified view of a second coil showing the use of the device in accordance with embodiments of the invention.
Figure 4B:
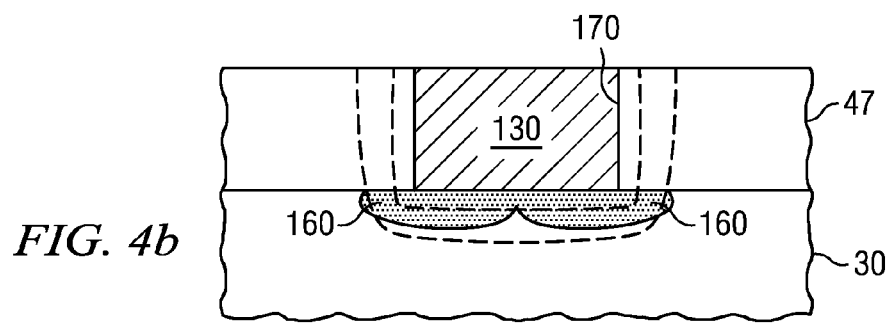

FIG. 4, which includes FIGS. 4a and 4b, illustrates a magnified view of a second coil showing the use of the device in accordance with embodiments of the invention. FIG. 4a illustrates equipotential lines without the trap regions, while FIG. 4b illustrates equipotential lines with the trap regions.

As illustrated in FIG. 4a, a second coil 130 is disposed above the second dielectric 30. Trap regions 160 are formed under the corners of the trenches 170 in FIG. 4b and not in FIG. 4a.

As illustrated in FIG. 4a, without the trap regions 160 the electric field is higher around the corner of the metal line (region labeled 161) due to the two-dimensional field enhancement according to classical electrostatics. However, in FIG. 4b, the sharp corner of the trenches 170 is shielded by a fast build-up of Coulomb shield in the trap regions 160. The electric field at the corners is therefore reduced below the critical level for degradation and breakdown. The two dimensional field enhancement is shifted deeper into the dielectric, the radius of curvature is widened and the maximum electric field, thus, is significantly reduced. Although a two-dimensional effect is shown for illustration, the principle if applicable as much to three-dimension effects at the corners/edges of the trench.

Although the embodiments described above related to reducing high local electric fields in transformers, embodiments of the invention equally apply to other types of devices requiring mitigation of high electric field effects. For example, embodiments of the invention may be applied to other types of devices including inductors, capacitors, resistors, as well as to interconnects of active devices.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device, the method comprising:

forming first trenches in an insulating material, wherein
        forming first trenches comprises:

forming a second dielectric over a first dielectric, the first dielectric comprising a plurality of dielectric layers or a single dielectric layer, and forming the first trenches in the second dielectric;

forming a trap region in the insulating material by introducing an impurity into the first trenches; and filling the first trenches with a conductive material.

2. The method of claim 1, wherein the first dielectric comprises the plurality of dielectric layers.

3. The method of claim 1, wherein the first dielectric comprises the single dielectric layer.

4. A method of fabricating a semiconductor device, the method comprising:

forming first trenches in an insulating material;

forming a trap region in the insulating material by introducing an impurity into the first trenches;

filling the first trenches with a conductive material;

forming second trenches in the insulating material, the second trenches being formed under the first trenches and being separated by a portion of the insulating material; and filling the second trenches with the conductive material.

5. The method of claim 4, wherein the filled first trenches form a first coil of a transformer, and wherein the filled second trenches form a second coil of the transformer.

6. The method of claim 1, wherein the impurity comprises silicon, germanium, or carbon.

7. The method of claim 1, wherein the impurity comprises a material selected from the group consisting of boron, indium, gallium, phosphorus, arsenic, and antimony.

8. The method of claim 1, wherein the impurity comprises an inert gas.

9. The method of claim 1, wherein the impurity comprises a metal.

10. A method of fabricating a semiconductor device, the method comprising:

forming first trenches in an insulating material;

forming a trap region in the insulating material by introducing an impurity into the first trenches, wherein introducing an impurity into the first trenches comprises implanting the impurity into the first trenches; and filling the first trenches with a conductive material.

11. The method of claim 10, wherein implanting the impurity comprises:

implanting at a first rotation at a first tilt relative to the normal to the top surface of the second insulating layer; and implanting at a second rotation at the first tilt relative to the normal to the top surface of the second insulating layer, wherein the first rotation and the second rotation are separated by about 180°.

12. The method of claim 11, wherein implanting at the first rotation forms a first portion of the trap region adjacent a first bottom corner of the first trenches, wherein implanting at the second rotation forms a second portion of the trap region adjacent a second bottom corner of the first trenches, the second bottom corner being opposite to the first bottom corner.

13. The method of claim 10, wherein implanting the impurity further comprises:

implanting at a first rotation at a first tilt relative to the normal to the top surface of the second insulating layer;

implanting at a second rotation at the first tilt relative to the normal to the top surface of the second insulating layer;

implanting at a third rotation at the first tilt relative to the normal to the top surface of the second insulating layer; and implanting at a fourth rotation at the first tilt relative to the normal to the top surface of the second insulating layer, wherein the first rotation and the second rotation are separated by about 90°, wherein the second rotation and the third rotation are separated by about 90°, and wherein the third rotation and the fourth rotation are separated by about 90°.

14. The method of claim 1, wherein the trap region has a shape of a partial dumbbell.

15. A method of fabricating a semiconductor device, the method comprising:

forming a first coil over a substrate;

forming an insulating material above the first coil;

forming trenches in the insulating material;

forming trap regions in the insulating material by implanting an impurity into the trenches; and forming a second coil in the insulating material by filling the trenches with a conductive material.

16. The method of claim 15, wherein forming the second coil further comprises forming a liner before filling the trenches with a conductive material.

17. The method of claim 15, wherein the trap regions are formed around the corners of the trenches in a partial dumbbell shape.

18. The method of claim 15, wherein implanting the impurity into the trenches comprises performing a four rotation tilted implantation.

19. The method of claim 15, wherein implanting the impurity into the trenches comprises performing a two rotation tilted implantation.

20. The method of claim 15, wherein the impurity comprises a material selected from the group consisting of carbon, silicon, germanium, boron, indium, gallium, phosphorus, arsenic, and antimony.

21. The method of claim 15, wherein the impurity comprises a metal selected from the group consisting of Ti, V, Cr, Mn, Fe, Co, Ni, Cu, Au, and Zn.

22. The method of claim 15, wherein the impurity comprises an element selected from the group consisting of helium, hydrogen, deuterium, argon, xeon, and neon.

23. The method of claim 15, wherein the trap regions are formed within about 50 nm from bottom surfaces of the trenches.

24. A transformer comprising:

a first coil overlying a semiconductor substrate;

an insulation material disposed over the first coil;

a second coil disposed in the insulation material; and a trap region comprising an impurity disposed under the second coil in the insulation material.

25. The transformer of claim 24, wherein the trap region extends about 50 nm from bottom surfaces of the second coil.

26. The transformer of claim 24, wherein the impurity comprises a material selected from the group consisting of carbon, silicon, germanium, boron, indium, gallium, phosphorus, arsenic, and antimony.

27. The transformer of claim 24, wherein the impurity comprises a metal selected from the group consisting of Ti, V, Cr, Mn, Fe, Co, Ni, Cu, Au, and Zn.

28. The transformer of claim 24, wherein the second coil is disposed within trenches in the insulating material, and wherein the trap regions are disposed around bottom corners of the trenches.

29. A method of fabricating a semiconductor device, the method comprising:

forming first trenches in an insulating material;

forming a trap region in the insulating material by introducing an impurity into the first trenches; and filling the first trenches with a conductive material, wherein the impurity comprises a material selected from the group consisting of silicon, germanium, carbon, boron, indium, gallium, phosphorus, arsenic, antimony, inert gas, and metal.

30. The method of claim 29, wherein the impurity comprises silicon, germanium, or carbon.

31. The method of claim 29, wherein the impurity comprises a material selected from the group consisting of boron, indium, gallium, arsenic, and antimony.

32. The method of claim 29, wherein the impurity comprises phosphorus.

33. The method of claim 29, wherein the impurity comprises an inert gas.

34. The method of claim 29, wherein the impurity comprises a metal.

* * * * *